United States Patent
Su et al.

(10) Patent No.: US 12,412,773 B2
(45) Date of Patent: Sep. 9, 2025

(54) VACUUM CHUCK

(71) Applicant: Taiwan Semiconductor Manufacturing Co., Ltd., Hsinchu (TW)

(72) Inventors: Po-Yu Su, Keelung (TW); Young-Wei Lin, Taoyuan (TW); Yu Liang Huang, Taoyuan (TW); Chia-Ching Lee, Taoyuan (TW); Chi-Chun Peng, Hsinchu County (TW); Chen Liang Chang, New Taipei (TW); Kuo Hui Chang, Taoyuan County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 493 days.

(21) Appl. No.: 17/876,381

(22) Filed: Jul. 28, 2022

(65) Prior Publication Data
US 2024/0038571 A1 Feb. 1, 2024

(51) Int. Cl.
H01L 21/683 (2006.01)
H01L 21/687 (2006.01)
H01L 21/67 (2006.01)

(52) U.S. Cl.
CPC .... *H01L 21/6838* (2013.01); *H01L 21/68721* (2013.01); *H01L 21/67288* (2013.01)

(58) Field of Classification Search
CPC ........... H01L 21/6838; H01L 21/68721; H01L 21/67288; H01L 21/6875; H01L 21/68785
See application file for complete search history.

(56) References Cited

U.S. PATENT DOCUMENTS 10,663,434 B2 * 5/2020 Wright ................. G01N 29/069
2020/0006104 A1 * 1/2020 Chen ......................... B08B 5/02

FOREIGN PATENT DOCUMENTS

| CN | 114220762 A | * | 3/2022 |
| CN | 114567957 A | * | 5/2022 |
| KR | 20190030929 A | * | 3/2019 |

OTHER PUBLICATIONS

CN-114220762-A PE2E translation (Year: 2022).*
CN-114567957-A PE2E translation (Year: 2022).*
KR-20190030929-A PE2E translation (Year: 2019).*

* cited by examiner

Primary Examiner — Sunil K Singh
Assistant Examiner — Dustin James Trujillo
(74) Attorney, Agent, or Firm — Seed Intellectual Property Law Group LLP (57) ABSTRACT

At least one embodiment, a vacuum chuck includes a moisture gate structure that allows for moisture to escape to reduce an amount of warpage in a workpiece when present on the vacuum chuck. The moisture gate structure includes a base portion that extends laterally outward from a central vacuum portion of the vacuum chuck, and a plurality of protrusions are spaced apart from the central vacuum portion and extend outward from the base portion. End surfaces of the plurality of protrusions contact a backside surface of the workpiece (e.g., a wafer on a carrier) when the workpiece is present on the vacuum chuck. The vacuum chuck may further include one or more guide portions that act as guides such that the workpiece remains properly aligned and within position when present on the vacuum chuck.

20 Claims, 9 Drawing Sheets

VACUUM CHUCK

BACKGROUND

Generally, in the manufacture of semiconductor devices, semiconductor packages, or integrated circuits within a semiconductor manufacturing plant (FAB) several workpieces or components (e.g., wafers, pattern lenses, dummy wafers, etc.) are transported between and through various workpiece processing tools (e.g., etching and lithography tools, patterning tools, EUV lithography tools, etc.) to refine and process the workpieces. These processing steps performed by the workpiece processing tools within the FAB result in the formation of a large number of conductive structures, such as transistors, in highly complex arrangements in conjunction with a substrate (e.g., semiconductor or silicon). These processing steps also may result in the formation of dielectric layers, metal interconnects, vias, plugs, and other integrated circuit structures and components.

Generally, in the manufacture of electrical or semiconductor devices, robots are often utilized to transfer and transport these workpieces in the manufacture of the semiconductor devices, semiconductor packages, or integrated circuits throughout the FAB. For example, a workpiece may be positioned on a vacuum chuck of the transfer robot and a vacuum may be generated through the vacuum chuck to hold the workpiece on the vacuum chuck. This vacuum may be generated utilizing a vacuum source that is in fluid communication with vacuum lines present within the vacuum chuck.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, semiconductor devices, semiconductor packages, or integrated circuits are manufactured within a semiconductor manufacturing or fabrication plant (FAB). These semiconductor devices, semiconductor packages, or integrated circuits may be manufactured by refining and processing workpieces such that the workpieces eventually become semiconductor devices, semiconductor packages, or integrated circuits. Multiple workpiece processing tools (e.g., etching tools, patterning tools, layer formation tools, sputtering tools, etc.) are utilized within the FAB to refine and process the workpieces to form the semiconductor devices, semiconductor packages, or integrated circuits. The workpieces may be transported through and between these workpiece processing tools within the FAB by robots, which may include vacuum chucks that are in fluid communication with a vacuum source. For example, a workpiece (e.g., a silicon wafer) may be positioned on one of the vacuum chucks, and the vacuum source, which is in fluid communication with the vacuum chuck, generates a vacuum at a surface of the vacuum chuck on which the workpiece is present. This vacuum holds the workpiece on the vacuum chuck, which may be referred to as a vacuum or seal effect. However, while being transported throughout the FAB and refined and processed by the workpiece processing tools, residual fluid or moisture utilized to refine or process the workpiece may remain on the workpiece after processing when present on the vacuum chuck. This residual fluid or moisture on the workpiece may become trapped between the workpiece and the surface of the vacuum chuck on which the workpiece is being transported by the transfer robot to which the vacuum chuck is mounted. This residual fluid or moisture between the workpiece and the surface of the vacuum chuck generally increases an amount of warpage within the workpiece. This warpage of the workpiece, which may be due to the presence of the residual fluid or moisture, increases the likelihood of the workpiece being damaged due to the warpage or increases the likelihood of manufacturing a defective semiconductor package, semiconductor device, or integrated circuit. The warpage of the workpiece, which may be due to the residual fluid or moisture, increases the likelihood of the workpiece falling off or shifting on the vacuum chuck while being transported within the FAB as the vacuum generated may not be strong enough to hold or maintain the workpiece's position on the vacuum chuck.

In view of the above, at least some of the present disclosure is directed to devices, systems, and methods to prevent warpage of workpieces as well as prevent improper positioning of the workpieces on vacuum chucks in accordance with the present disclosure when being transferred or transported through a semiconductor manufacturing or fabrication plant (FAB). For example, a vacuum chuck in accordance with some embodiments of the present disclosure includes a moisture gate structure or portion. This moisture gate structure or portion provides a pathway through which residual fluid or moisture that remains on the workpiece may escape or evaporate through when the workpiece is present on the vacuum chuck in accordance with some embodiments of the present disclosure. The escaping of the residual fluid or moisture through the drainage structure or portion of the vacuum chuck in accordance with some embodiments of the present disclosure reduces or mitigates an amount of warpage of the workpiece. Reducing the amount of warpage of the workpiece when present on the vacuum chuck, reduces the likelihood of the workpiece falling off or shifting when present on the vacuum chuck when being transferred or transported through the FAB, and increases a yield number of semiconductor devices, semiconductor packages, or integrated circuits that are manufactured within tolerance.

In other words, this reduction in the amount of warpage of the workpieces by utilizing the vacuum chuck with the moisture gate structure or portion, which may also be referred to as a drainage structure or portion, of the present disclosure, increases a yield number of the FAB such that a greater number of semiconductor devices, semiconductor packages, or integrated circuits are manufactured within tolerance and may be sold to customers increasing profitability and reducing waste expenses. For example, this prevention of warpage of the workpiece by the presence of the moisture gate structure or portion of the vacuum chuck allows a vacuum generated through the vacuum chuck by a vacuum source to be strong enough to hold and maintain the position of the workpiece on the vacuum chuck. In other words, the vacuum or seal effect is stronger reducing the likelihood of the workpiece shifting out of place when present on vacuum chuck. This mitigating or reducing the likelihood of shifting of the workpiece may increase productivity of the FAB as the workpiece is properly aligned when positioned within a workpiece processing tool either when present on the vacuum chuck or when removed from the vacuum chuck.

In view of the above, a vacuum chuck in accordance with some embodiments of the present disclosure may include one or more guide structures, portions, or frames that prevent the workpiece from falling off or shifting when present on the vacuum chuck. For example, the one or more guide structures, portions, or frames may include one or more guide protrusions or extensions that are adjacent to an edge of the workpiece. These guide protrusions or extensions may contact the edge of the workpiece when transferring or transporting the workpiece on the vacuum chuck between various locations within the FAB. Reducing the shifting of the workpiece when present on the vacuum chuck, as well as preventing the workpiece from falling off the vacuum chuck by the presence of the one or more guide structures, portions, or frames, increases the yield number of semiconductor devices, semiconductor packages, or integrated circuits that are manufactured by the FAB within tolerance.

Figure 1A:
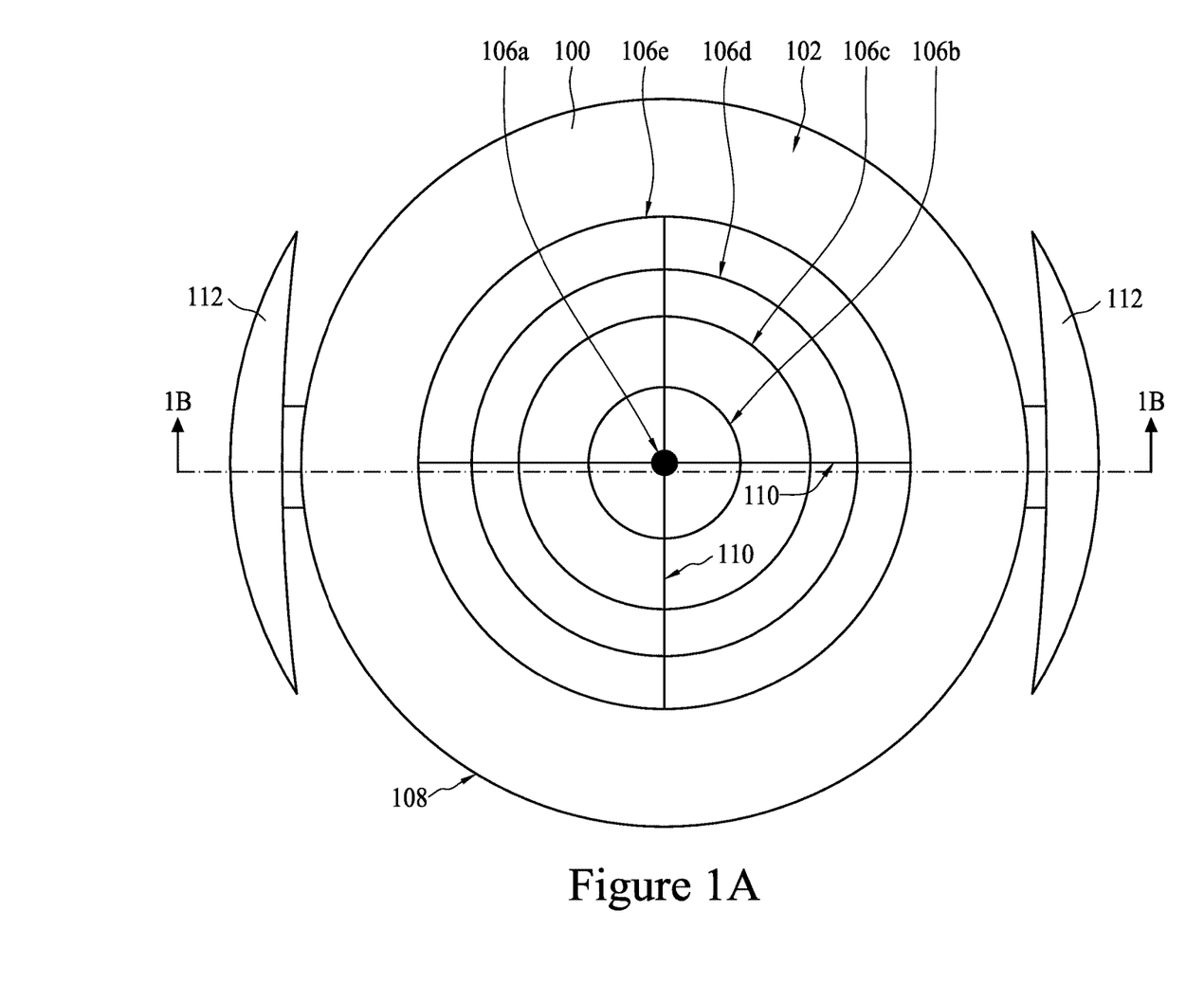
FIG. 1A is a top plan view of an example of a vacuum chuck.

FIG. 1A is a top plan view of an example of a vacuum chuck 100. The vacuum chuck 100 includes a workpiece surface 102 on which a workpiece 104 (see FIG. 1B) may be positioned for transferring or transporting the workpiece 104 through a semiconductor manufacturing or fabrication plant (FAB). The workpiece 104 may be a production wafer made of a silicon material, a semiconductor material, or some other suitable type of material. The workpiece 104 may have a diameter of 300-mm or may have some other suitable diameter. A plurality of vacuum openings 106a, 106b, 106c, 106d, 106e are present at the workpiece surface 102. The plurality of vacuum openings 106a, 106b, 106c, 106d, 106e includes a first opening 106a, a second opening 106b, a third opening 106c, a fourth opening 106d, and a fifth opening 106e. The first opening 106a is a central opening that is present at a center of the vacuum chuck 100, and the second, third, fourth, and fifth openings 106b, 106c, 106d, 106e are peripheral openings that are successively spaced apart from the first opening 106a. The second, third, fourth, and fifth openings 106b, 106c, 106d, 106e successively surround each other and all surround the first opening 106a. The plurality of openings 106a, 106b, 106c, 106d, 106e are spaced inward from a peripheral sidewall 108 of the vacuum chuck 100.

A pair of transverse vacuum openings 110 extend from the first opening 106a to the fifth opening 106e. A first one of the pair of transverse vacuum openings 110 is transverse to a second one of the pair of transverse vacuum openings 110. The pair of transverse vacuum openings 110 are spaced inward from the peripheral sidewall 108 of the vacuum chuck 100.

A pair of opposing mounting structures or portions 112 extend outward from the peripheral sidewall 108 of the vacuum chuck 100. The pair of opposing mounting structures 112 includes a first one at the left-hand side of the vacuum chuck 100, a second one at the right-hand side of the vacuum chuck 100, and the first one is opposite to the second one. The mounting structures 112 are configured to be utilized in mounting the vacuum chuck 100 to a transfer robot, which may be utilized to transfer or transport one or more workpieces within the FAB. For example, one or more clamps 400 may be utilized to mount the vacuum chuck 100 to a robot 300 (See FIGS. 3A, 3B, and 4 of the present disclosure).

Figure 1B:
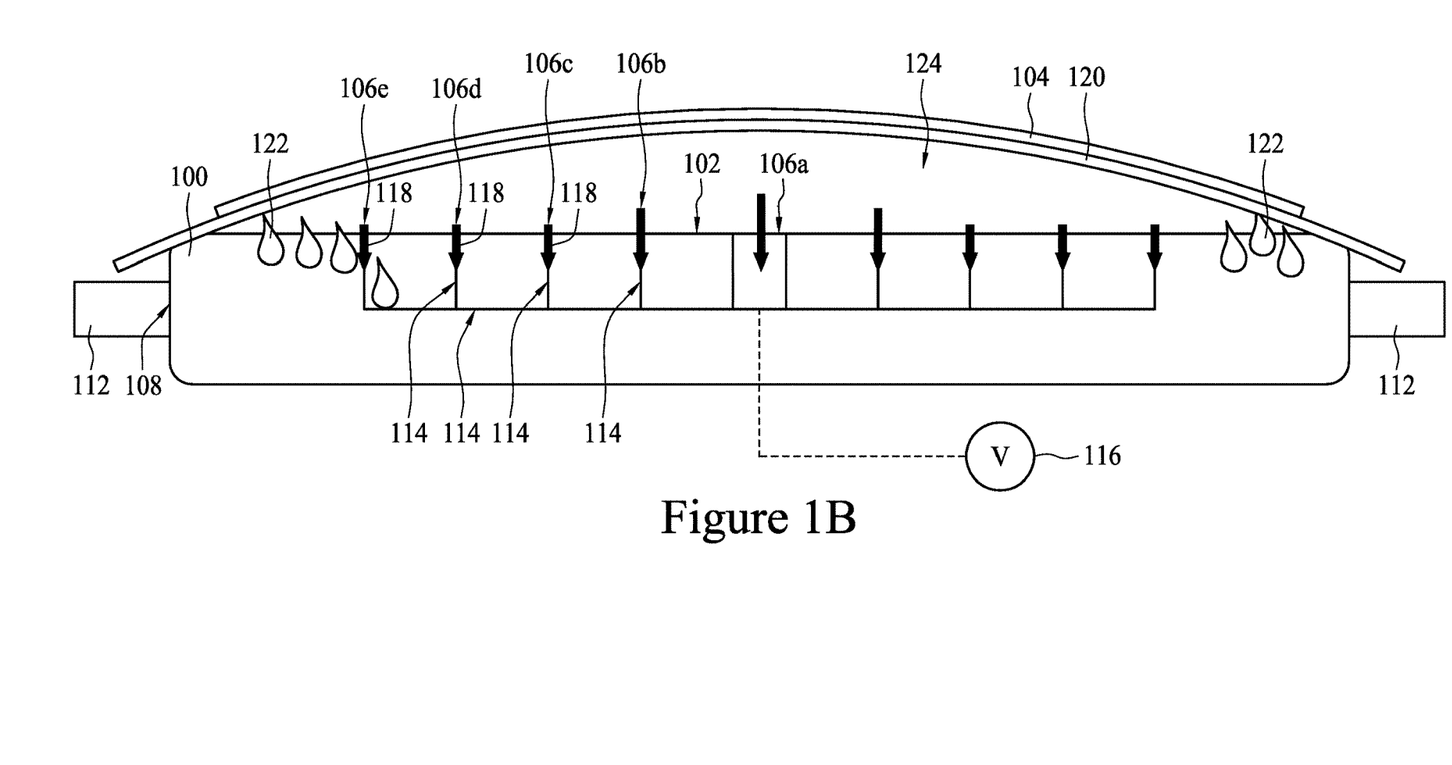
FIG. 1B is a cross-sectional of the example of the vacuum chuck taken along line 1B-1B as shown in FIG. 1A.

FIG. 1B is a cross-sectional view of the vacuum chuck 100 taken along lines 1B-1B as shown in FIG. 1A. A plurality of vacuum lines 114 that are in fluid communication with the plurality of vacuum openings 106a, 106b, 106c, 106d, 106e. For example, each one of the plurality of vacuum lines 114 is in fluid communication with at least one of the plurality of vacuum openings 106a, 106b, 106c, 106d, 106e, respectively. The plurality of vacuum lines 114 and the plurality of vacuum openings 106a, 106b, 106c, 106d, 106e are in fluid communication with a vacuum source 116 (e.g., a vacuum pump or some other suitable type of vacuum generation device or system), which is configured to generate a vacuum 118 through the plurality of vacuum lines 114 and the plurality of vacuum openings 106a, 106b, 106c, 106d, 106e. The vacuum 118 is represented by arrows 118. The vacuum 118 generates suction such that the workpiece 104 is held in place on the vacuum chuck 100.

A carrier or support 120 is present on a backside surface of the workpiece 104. The carrier 120 may be present to provide support to the workpiece 104. The carrier 120 may be a tape, for example, a double-sided tape that is utilized to assist in holding the workpiece 104 on the vacuum chuck 100 along with the vacuum 118.

When the workpiece 104 is being refined and processed through one or more workpiece processing tools (e.g., etching and lithography tools, patterning tools, EUV lithography tools, etc.) within the FAB, a residual fluid or moisture 122 may build up on or be present on the workpiece 104 and/or the carrier 120. The residual fluid or moisture 122 present on the workpiece 104 or the carrier 120 becomes trapped within a space 124 between the carrier 120 and the workpiece surface 102. The residual fluid or moisture 122 results in the workpiece 104 and the carrier 120 warping such that the workpiece 104 and the carrier 120 have a radius of curvature as shown in FIG. 1B. This warpage of the workpiece 104 and the carrier 120 resulting in the radius of curvature of the workpiece 104 as shown in FIG. 1B may increase the likelihood that the workpiece 104 will be damaged and may increase the likelihood the workpiece 104 will fall off the vacuum chuck 100 or shift out of place on the vacuum chuck 100. The increased likelihood of falling or shifting of the workpiece 104 may be result of the space 124 increasing in size due to the warpage of the workpiece 104 such that vacuum 118 generated is not strong enough to hold the workpiece 104 in position on the vacuum chuck 100.

A point along the backside surface of the carrier 120 furthest away from the workpiece surface 102 may be equal to or less than 6-millimeters (mm). In some embodiments, the point along the backside surface of the carrier 120 furthest away from the workpiece surface 102 may be greater than 6-mm. The amount of warpage may depend on the size and shape of the workpiece 104 and the carrier 120, respectively.

This increase in the likelihood of damaging the workpiece 104 as well as the increase in the likelihood of the workpiece 104 falling or shifting generally decreases a yield number of usable semiconductor devices, semiconductor packages, or integrated circuits that are manufactured utilizing the FAB. For example, if cracks or scratches propagate on or within the workpiece 104, a semiconductor package or die manufactured utilizing the workpiece 104 may not function as intended and/or may be out of tolerance such that the semiconductor package or die is defective. This out-of-tolerance or defective semiconductor package is not capable of being sold to a customer for profit. Similarly, if the workpiece 104 is out of position on the vacuum chuck 200, the workpiece 104 may be improperly patterned due to the misalignment resulting in a semiconductor package or die manufactured utilizing the workpiece that is manufactured out of tolerance and/or defective. This out-of-tolerance or defective semiconductor package is not capable of being sold to a customer for profit.

Figure 2A:
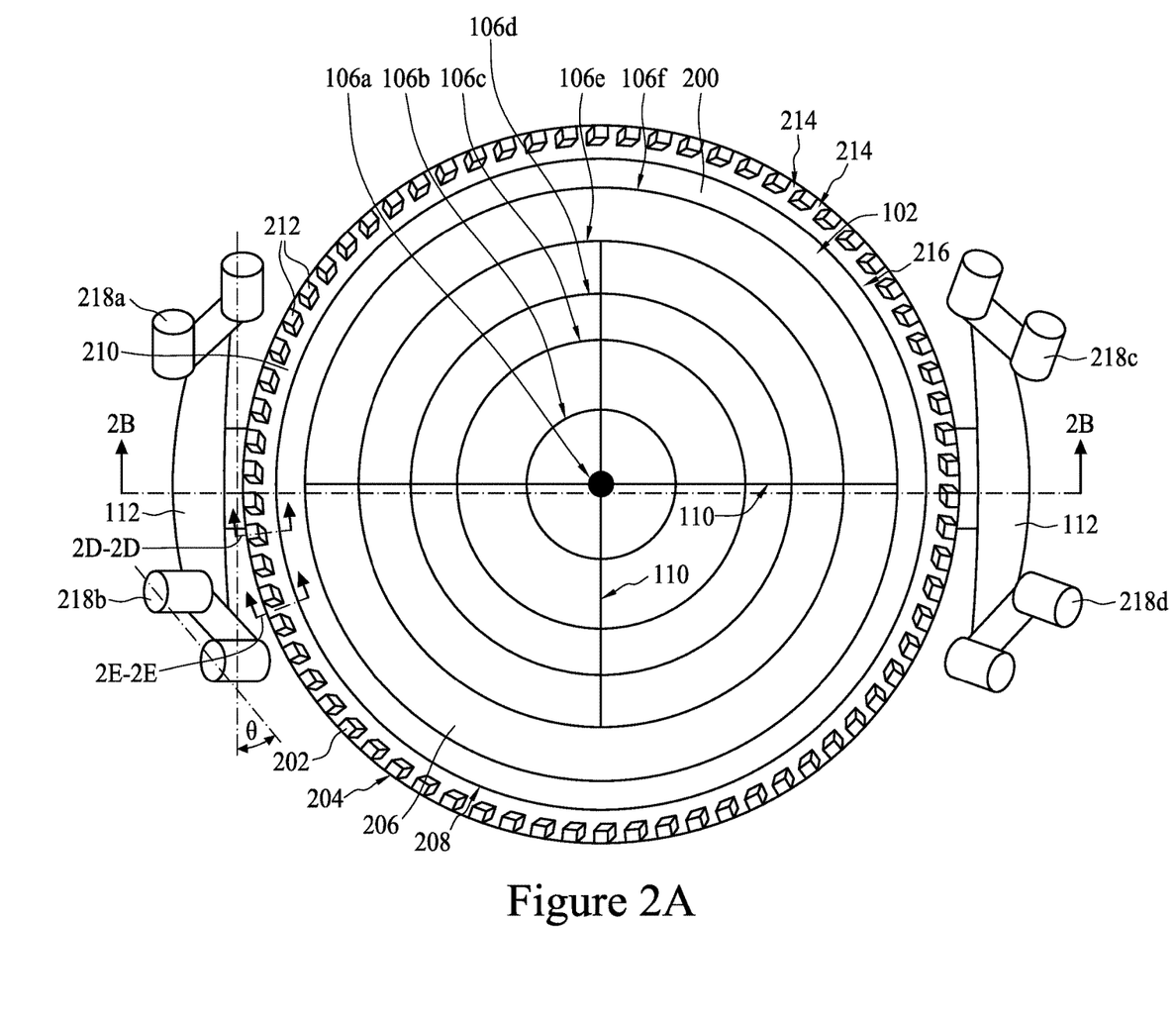
FIG. 2A is a top plan view of an example of a vacuum chuck, in accordance with some embodiments.

FIG. 2A is a top plan view of an example of a vacuum chuck 200, in accordance with some embodiments. The vacuum chuck 200 as shown in FIG. 2A has some of the same or similar features of the vacuum chuck 100 as shown in FIGS. 1A and 1B. Accordingly, these same or similar features of the vacuum chuck 200 as compared to the vacuum chuck 100 have the same or similar reference numerals.

As shown in FIG. 2A, the vacuum chuck 200 includes the plurality of vacuum openings 106a, 106b, 106c, 106d, 106e. However, unlike the plurality of vacuum openings 106a, 106b, 106c, 106d, 106e of the vacuum chuck 100 as shown in FIGS. 1A and 1B in which there are five total, the plurality of vacuum openings 106a, 106b, 106c, 106d, 106e of the vacuum chuck 200 includes a sixth vacuum opening 106f, which surrounds the first, second, third, fourth, and fifth vacuum openings 106a, 106b, 106c, 106d, 106e of the plurality of vacuum openings 106a, 106b, 106c, 106d, 106e. The vacuum chuck 200 may include more vacuum openings relative to the vacuum chuck 100 due to the presence of a moisture gate portion or structure 202 at a peripheral edge 204 of the vacuum chuck 200. The peripheral edge 204 may be a sidewall of the vacuum chuck 200. The moisture gate portion 202 may be referred to as a moisture escape structure, a moisture release structure, a water escape structure, a drainage structure, or some other reference to the moisture gate portion or structure 202 that allows moisture to escape from underneath a workpiece when present over the workpiece surface 102 of the vacuum chuck 200. The moisture gate portion 202 extends outward from a central vacuum portion or structure 206. For example, the moisture gate portion 202 is a peripheral portion of the vacuum chuck 200 that surrounds the central vacuum portion 206 and extends from a sidewall 208 of the central vacuum portion 206. The sidewall 208 may be at an edge of the central vacuum portion 206.

A base portion 210 of the moisture gate portion 202 extends laterally outward from the sidewall 208 of the central vacuum portion 206. The base portion 210 may be referred to as a cantilever portion, a shelf portion, a ledge portion, a lip portion, or some other similar or like reference to the base portion 210 protruding or extending laterally outward from the sidewall 208 of the central vacuum portion 206.

A plurality of protrusions or extensions 212 protrude or extend outward from the base portion 210. Each one of the plurality of protrusions 212 is spaced apart from adjacent ones of the plurality of protrusions 212. For example, a plurality of channels 214 are present between adjacent ones of the plurality of protrusions 212 such that the plurality of channels 214 are separate and distinct from each other. In other words, each one of the plurality of channels 214 is between pairs of adjacent ones of the plurality of protrusions 212. In some embodiments, the plurality of protrusions are integral with the base portion such that the base portion 210 and the plurality of protrusions 212 are made of a single continuous material. In some embodiments, the plurality of protrusions 212 may be made of a moisture resistant or proof material and the plurality of protrusions 212 are coupled to a surface 224 (see FIGS. 2D and 2E) of the base portion 210.

Each one of plurality of channels 214 extends laterally outward from a main channel 216 that surrounds the central vacuum portion 206 and that extends from the sidewall 208 of the central vacuum portion 206 to the plurality of protrusions 212. The main channel 216 is in fluidic communication with each one of the plurality of channels 214. The workpiece surface 102 is a surface of the central vacuum portion 206 of the vacuum chuck 200. The main channel 216 and the plurality of channels 214 are configured to act as fluid pathways that allow moisture and/or fluids to escape or evaporate through to reduce warpage in a workpiece when present on the workpiece surface 102 of the vacuum chuck 200.

In this embodiment as shown in FIG. 2A, the main channel 216 has a circular profile that extends around a perimeter of the central vacuum portion 206 as the central vacuum portion 206 has a circular profile. However, it will be readily appreciated that the profile of the main channel 216 may be different based on the profile of the central vacuum portion 206. For example, if the central vacuum portion 206 has a rectangular or square profile, the main channel 216 may similarly have a rectangular or square profile that extends around a perimeter of the central vacuum portion 206. In other words, the main channel 216 extends around a boundary of the central vacuum portion 206 such that the main channel 216 surrounds the central vacuum portion 206.

The vacuum chuck 200 includes the pair of opposing mounting structures or portions 112. However, unlike the vacuum chuck 100, ones of a plurality of guide portions 218a, 218b, 218c, 218d protrude or extend outward from each of the pair of opposing mounting structures 112, respectively. As shown in FIG. 2A, there are four of the plurality of guide portions 218a, 218b, 218c, 218d. However, in some alternative embodiments, there may be a greater or a lesser number of ones of the plurality of guide portions 218a, 218b, 218c, 218d than the four as shown in FIG. 2A.

A first guide portion 218a and a second guide portion 218b protrude or extend outward from the mounting structure 112 at the left-hand side of the vacuum chuck 200 based on the orientation as shown in FIG. 2A, and a third guide portion 218c and a fourth guide portion 218d protrude or extend outward from the mounting structure 112 at the right-hand side of the vacuum chuck 200. Each one of the plurality of guide portions 218a, 218b, 218c, 218d is angled by an angle θ relative to a vertical axis that extends in a direction directed from opposing ones of the guide portions 218a, 218b at the left-hand side of the vacuum chuck 200. The angle θ may be 5-degrees, 10-degrees, 15-degrees, 30-degrees, 40-degrees, or some other suitable angle that may be selected based on a size, shape, and profile of a workpiece to be positioned on the vacuum chuck 200. This workpiece may be coupled to a carrier similar to the carrier 120.

The plurality of guide portions 218a, 218b, 218c, 218d are configured to act as guides such that a workpiece is properly positioned on vacuum chuck 200, and to act as barriers to prevent the workpiece on the vacuum chuck 200 from falling off or shifting too much when being transported utilizing the vacuum chuck 200 or when being processed or refined when the workpiece is present on the vacuum chuck 200. In other words, the plurality of guide portions 218a, 218b, 218c, 218d reduces the likelihood of the workpiece being misaligned when being placed on the vacuum chuck 200, and the plurality of guide portions 218a, 218b, 218c, 218d reduces the likelihood of the workpiece being damaged when present on the vacuum chuck 200 as the likelihood of the workpiece falling off or shifting too much when present on the vacuum chuck 200 is reduced.

Figure 2B:
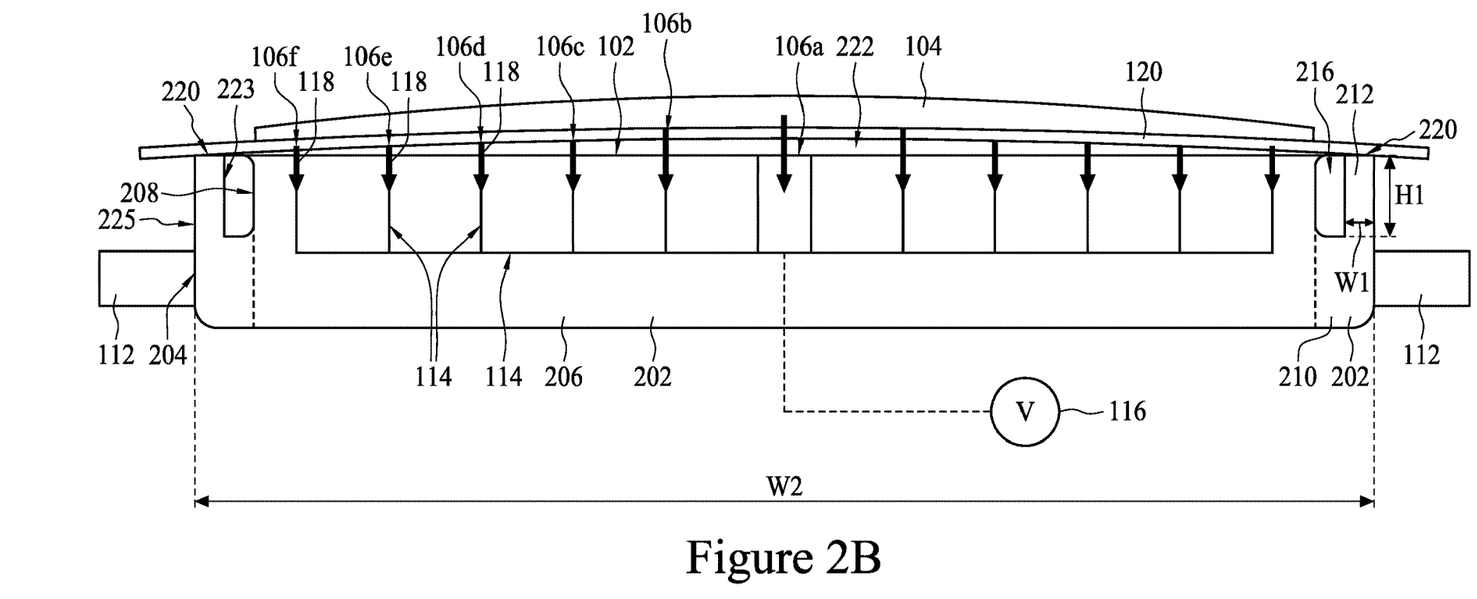
FIG. 2B is a cross-sectional view of an example of the vacuum chuck taken along line 2B-2B as shown in FIG. 2A, in accordance with some embodiments.

FIG. 2B is a cross-sectional view of the vacuum chuck 200 taken along line 2B-2B as shown in FIG. 2A. The vacuum chuck 200 includes the plurality of vacuum lines 114, and each one of the plurality of vacuum lines 114 is in fluid communication with at least one of the plurality of vacuum openings 106a, 106b, 106c, 106d, 106e, 106f of the vacuum chuck 200. The vacuum source is in fluid communication with the plurality of vacuum lines 114 such that the workpiece 104 may be held in position by the vacuum 118 generated by the vacuum source 116 through the plurality of vacuum lines 114 and the plurality of vacuum openings 106a, 106b, 106c, 106d, 106e, 106f. The vacuum 118 generated is represented by the arrows 118. The vacuum 118 generates suction such that the workpiece 104 to which the carrier 120 is coupled is held in place on the vacuum chuck 200.

Each one of the plurality of protrusions 212 includes an end surface 220 on which the carrier 120 is present and is supported by when present on the vacuum chuck 200. For example, the end surfaces 220 come into contact with a peripheral region of a backside surface of the carrier 120 such that, when present on the vacuum chuck 200, the workpiece 104 and the carrier 120 are supported by the end surfaces 220 of the plurality of protrusions 212. In some embodiments, the end surfaces 220 of the plurality of protrusions 212 may be coplanar with the workpiece surface 102. In some alternative embodiments, the end surfaces 220 of the plurality of protrusions may be slightly raised relative to the workpiece surface 102 such that the residual fluid or moisture 122 may more readily escape through the plurality of channels 214 and the main channel 216, respectively, as the carrier 120 may be further spaced apart from the workpiece surface 102. However, this raised distance is balanced with respect to the vacuum 118 generated such that the vacuum or seal effect maintains a strong hold on the workpiece and the carrier 120 when present on the vacuum chuck 200.

Heights H1, widths W1, and lengths of the plurality of protrusions 212 may be adjusted and adapted to more readily allow the escape or evaporation of the residual fluid or moisture 122, respectively. For example, each one of the plurality of protrusions 212 has the height H1, the width W1 that is transverse to the height H1, and the length that is transverse to both the height H1 and the width W1. The height H1 of each one of the plurality of protrusions 212 extends from the base portion 210 to the corresponding end surface 220 of the plurality of protrusions 212, respectively. The width W1 of each one of the plurality of protrusions 212 extends from an inner sidewall 223 of one of the plurality of protrusions 212 to an outer sidewall 225 of the one of the plurality of protrusions 212. While not readily visible in FIG. 2B, the length of each one of the plurality of protrusions extends inward or outward of the page such that the length is transverse to both the height H1 and the width W1. In some embodiments, the height H1 may be equal to or less than 20-mm (millimeters), the width W1 may be equal to or less than 100-mm, and the length may be equal to or less than 100-mm. In some embodiments, in the plurality of protrusions 212 the width W1 may be equal to 1.9-mm and the height H1 may be equal to 1.9-mm.

Unlike the workpiece 104 as shown in FIG. 1B in which a relatively large amount of warpage (e.g., flexure and bending) occurred due to the residual fluid or moisture 122 built up and present on the workpiece 104, the workpiece 104 as shown in FIG. 2B has no or has a miniscule amount of warpage due to the moisture gate portion 202 of the vacuum chuck 200 being present. For example, the main channel 216 and the plurality of channels 214 of the moisture gate portion 202 allows the residual fluid or moisture 122, which is on or along the workpiece 104 and the carrier 120, to escape or evaporate as the residual fluid or moisture 122 may readily pass through the main channel 216 and the plurality of channels 214 of the moisture gate portion 202.

A space 222 is present between the backside surface of the carrier 120 and the workpiece surface 102 of the central vacuum portion 206. The space 222 is similar to the space 124, however, the space 222 as shown in FIG. 2B is smaller than the space 124 as the residual fluid or moisture 122 is capable of escaping through the main channel 216 and the plurality of channels 214. This results in a miniscule or non-existent amount of warpage in the workpiece 104 and the carrier 120. In other words, in the event of a miniscule amount of warpage, a radius of curvature of the workpiece 104 and the carrier 120 as shown in FIG. 2B is less than the warpage in the workpiece 104 and the carrier 120 as shown in FIG. 1B. This miniscule or non-existent warpage in the workpiece 104 and the carrier 120 as shown in FIG. 2B relative to FIG. 1B results in the space 222 as shown in FIG. 2B being smaller than the space 124 as shown in FIG. 1B.

This reduced warpage in the workpiece 104 and the carrier 120 as shown in FIG. 2B relative to as shown in FIG. 1B reduces the likelihood of damage propagating within the workpiece 104 and/or the carrier 120. For example, there is a reduced likelihood of crack propagation occurring within the workpiece 104 and the carrier 120 as there is less bending and flexing due to the miniscule or non-existent warpage as shown in FIG. 2B, and there is less stress and strain that occurs within the workpiece 104 and carrier 120 due to the miniscule or non-existent warpage as shown in FIG. 2B.

This reduced warpage in the workpiece 104 and the carrier as shown in FIG. 2B relative to as shown in FIG. 1B reduces the likelihood of workpiece falling off or shifting while the workpiece 104 and the carrier 120 are present on the vacuum chuck 200. When utilizing the vacuum chuck 200, the miniscule or non-existent warpage in the workpiece 104 and the carrier 120 as shown in FIG. 2B results in a first surface area at a region of the backside surface of the carrier 120 being in contact with the vacuum chuck 200, and results in the vacuum 118 maintaining a good hold on the workpiece 104 and the carrier 120. When utilizing the vacuum chuck 100, the larger amount of warpage in the workpiece 104 and the carrier 120 as shown in FIG. 1B results in a second surface area at a region of the backside surface of the carrier 120 being in contact with the vacuum chuck 100. The first surface area is larger than the second surface area such that the workpiece 104 and the carrier 120 will shift less or not shift at all when present on the vacuum chuck 200. This shifting of the workpiece 104 and the carrier 120 may be further limited by the presence of the plurality of guide portions 218a, 218b, 218c, 218d. A width of the guide portions 218a, 218b, 218c, 218d may be equal to or less than 50-mm.

The reduced likelihood of shifting and reduced amount of warpage of the workpiece 104 and the carrier 120 when utilizing the vacuum chuck 200 reduces the likelihood of misalignment of the workpiece 104 and the carrier 120 when being refined or processed within a workpiece processing tool. For example, if the workpiece 104 and the carrier 120 on the vacuum chuck 200 are positioned within a laser patterning tool, the small to no shifting of the workpiece 104 when present on the vacuum chuck 200 increases the likelihood of proper alignment of the workpiece 104 relative to the laser such that the workpiece 104 is accurately and properly patterned.

Alternatively, when the workpiece 104 and the carrier 120 are on the vacuum chuck 100 and are positioned within the laser patterning tool, the workpiece 104 and the carrier 120 may have an increased likelihood of shifting or warpage. For example, this increase in the likelihood of shifting and warpage increases the likelihood of misalignment between the laser of the laser patterning tool and the workpiece 104 when being positioned within the laser patterning tool utilizing the vacuum chuck 100. If misalignment occurs, which is more likely with the vacuum chuck 100 than the vacuum chuck 200, the workpiece 104 may be patterned in an unexpected manner or inaccurately such that a semiconductor package or device may be manufactured outside of pre-determined tolerances (e.g., quality control). The manufacture of insufficient quality semiconductor packages or devices results in increased waste costs of a FAB.

The vacuum chuck 200 has a width W2 that extends from opposing points of a pair of points of the vacuum chuck 200 as shown in FIG. 2B. When the vacuum chuck 200 has a circular profile, the width W2 is a diameter of the vacuum chuck 200. The width W2 may be equal to or greater than 150-mm. In some embodiments, the width W2 may be slightly larger than a width or diameter of the workpiece 104 on the carrier 120, and the width W2 may be slightly less than a width or diameter of the carrier 120. For example, this dimensional relationship may be readily seen in the embodiment as shown FIG. 2B of the present disclosure.

Figure 2C:
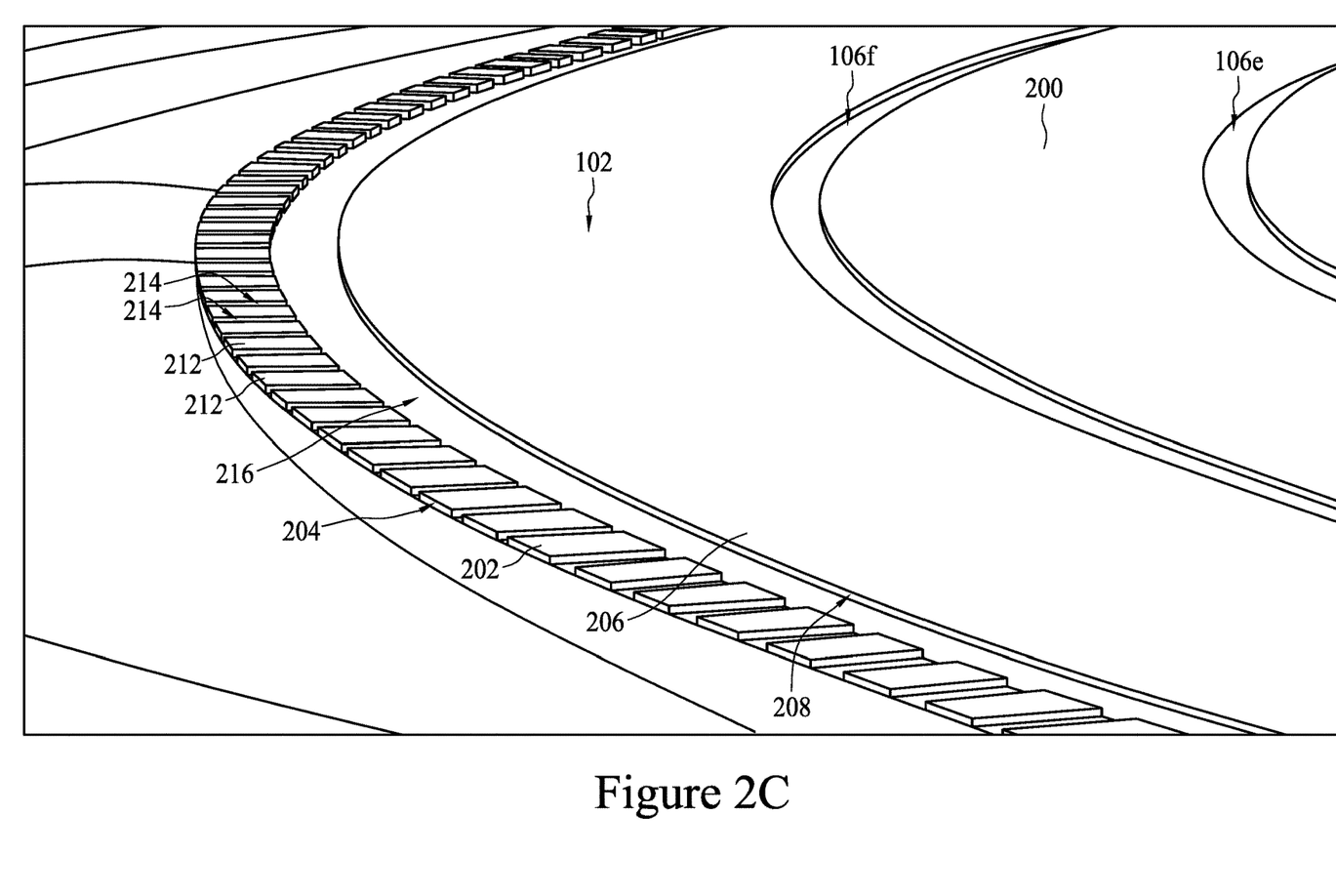
FIG. 2C is a partial, perspective view of an example of the vacuum chuck as shown in FIGS. 2A and 2B, in accordance with some embodiments.

FIG. 2C is a partial, perspective view of an example of the vacuum chuck 200 as shown in FIGS. 2A and 2B, in accordance with some embodiments. As may be more readily seen in FIG. 2C, each one of the plurality of protrusions 212 is spaced apart from adjacent ones of the plurality of protrusions 212 by ones of the plurality of channels 214, respectively. Each one of the adjacent ones of the plurality of protrusions 212 may be spaced apart by a distance equal to or less than 50-mm. In other words, the plurality of channels 214 may have a length extending between sidewalls of adjacent ones of the plurality of protrusions 212. In some embodiments, the length may be equal to or less than 50-mm. For example, the length of each one of the plurality of channels 214 may be less than 1.3-mm and a pitch measurement between adjacent ones of the plurality of protrusions 212 may be equal to 1.3-mm. The length of the plurality of channels 214 and the pitch measurement between adjacent ones of the plurality of protrusions 212 may be adjusted and adapted to allow the residual moisture 122 to escape and evaporate through the plurality of channels 214, respectively. The dimensions of the moisture gate portion 202 of the vacuum chuck 200 and the vacuum chuck 200 may be selected depending on the size and shape of the workpiece 104 and the carrier 120.

A width of the plurality of channels 214 is transverse to the length of the plurality of channels 214 and extends away from the peripheral edge 204 to the inner sidewall 223. In some embodiments, the width of the plurality of channels 214 may range from 1-mm to 3-mm, and may be equal to the upper and lower ends of this range. The width of the plurality of channels 214 may be adjusted to allow for the residual moisture or fluid to escape or evaporate. A height of the plurality of channels 214 may be equal to the height H1.

Figure 2D:
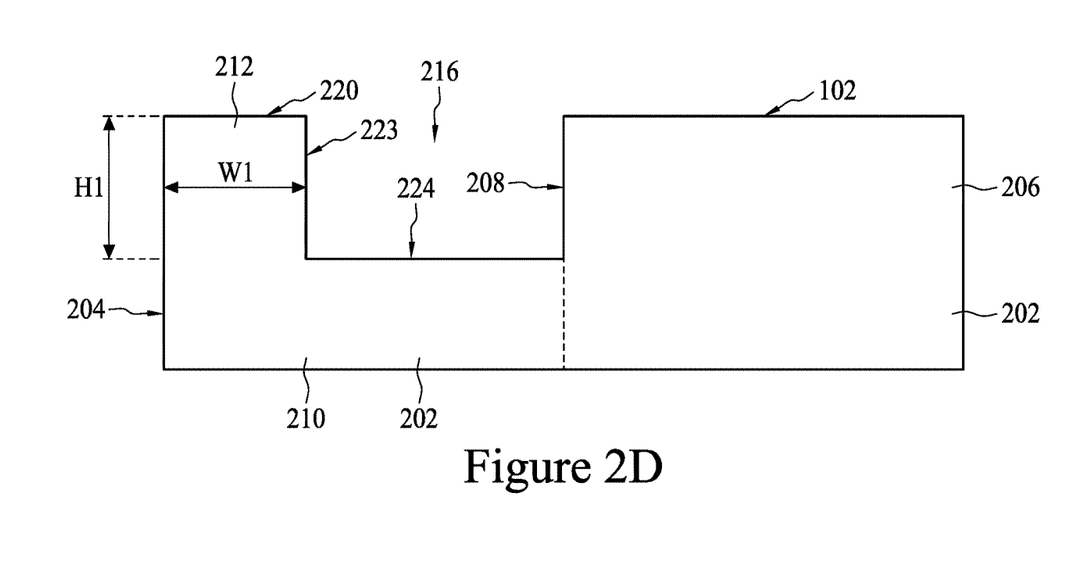
FIG. 2D is a zoomed in, cross-sectional view of the vacuum chuck taken along line 2D-2D as shown in FIG. 2A, in accordance with some embodiments.

FIG. 2D is a zoomed in, cross-sectional view of the vacuum chuck 200 taken along line 2D-2D as shown in FIG. 2A. The line 2D-2D is along a respective one of the plurality of protrusions 212. Each one of the plurality of protrusions 212 includes an inner sidewall 223 that is transverse to a corresponding one of the plurality of end surfaces 220 of the plurality of protrusions 212. The inner sidewalls 223 face towards the sidewall 208 of the central vacuum portion 206. The inner sidewalls 223 extend from the surface 224 of the base portion 210 to corresponding ones of the end surfaces 220 of the plurality of protrusions 212. The surface 224 of the base portion 210 is transverse to the inner sidewalls 223 and transverse to the sidewall 208 of the central vacuum portion 206. The sidewall 208 of the central vacuum portion 206, the inner sidewalls 223 of the plurality of protrusions 212, and the surface 224 of the base portion 210 at least partially delimit the main channel 216.

Figure 2E:
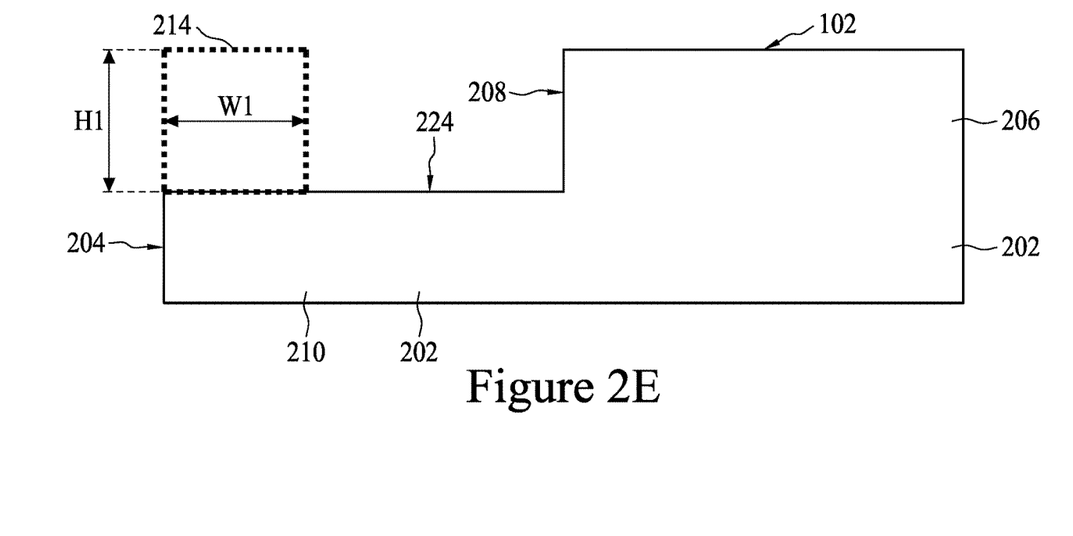
FIG. 2E is a zoomed in, cross-sectional view of the vacuum chuck taken along line 2E-2E as shown in FIG. 2A, in accordance with some embodiments.

FIG. 2E is a zoomed in, cross-sectional view of the vacuum chuck 200 taken along 2E-2E as shown in FIG. 2A. The line 2E-2E is along a respective one of the plurality of channels 214. The dotted line is representative of one of the plurality of channels 214 that is between a pair of adjacent ones of the plurality of protrusions 212. As shown in FIG. 2E, each one of the plurality of channels 214 may have the height H1.

Figure 3A:
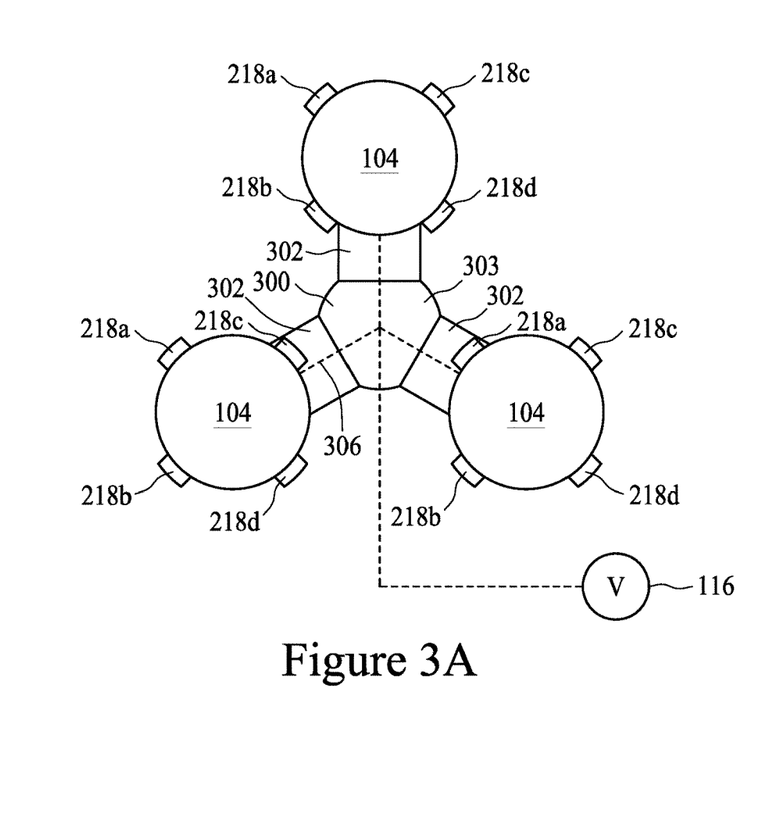
FIG. 3A is a top plan view of a robot including the vacuum chuck as shown in FIGS. 2A-2E, in accordance with some embodiments.

FIG. 3A is a top plan view of a robot (e.g., a transfer robot) 300 that includes a central hub 303 and a plurality of arms 302 that extend from the central hub 303. While not readily visible, each one of the plurality of arms 302 is coupled to a corresponding one of a plurality of the vacuum chucks 200, in accordance with some embodiments. For example, each one of the plurality of vacuum chucks 200 is at a corresponding end of one of the plurality of arms 302 opposite to the ends of the plurality of arms 302 that are coupled to the central hub 303. Each one of the plurality of vacuum chucks 200 may be mounted to each one of the plurality of arms 302 by the one or more clamps 400 (see FIG. 5 of the present disclosure).

As shown in FIG. 3A, a plurality of the workpieces 104 are on the plurality of vacuum chucks 200. For example, each one of the plurality of the workpieces 104 is on a corresponding one of the plurality of vacuum chucks 200 such that there is a one to one relationship as shown in FIG. 3. Each one of the plurality of workpieces 104 is within corresponding ones of the plurality of guide portions 218a, 218b, 218c, 218d, respectively, of the vacuum chucks 200. The guide portions 218a, 218b, 218c, 218d are configured to guide the workpieces 104 onto the vacuum chucks 200 such that the workpieces 104 are properly aligned with a corresponding one of the vacuum chucks 200, and the guide portions 218a, 218b, 218c, 218d are configured to act as barriers to reduce the likelihood of the workpieces 104 becoming misaligned due to shifting when present on the vacuum chucks 200 or from falling off the vacuum chucks 200.

The vacuum source 116 is fluidically coupled to fluid pathways 306 that pass through or extend along the robot 300. In some embodiments, the vacuum source 116 is integrated within the robot 300. The fluid pathways 306 may be referred to as vacuum fluid pathways, vacuum pathways, or some other similar or like reference of the fluid pathways 306, which are configured to be utilized to generate the vacuum 118. These fluid pathways 306 are in fluid communication with the plurality of vacuum lines 114 of the plurality of the vacuum chucks 200 to generate the vacuums 118 to hold the plurality of the workpieces 104 on each corresponding one of the plurality of the vacuum chucks 200, respectively.

Figure 3B:
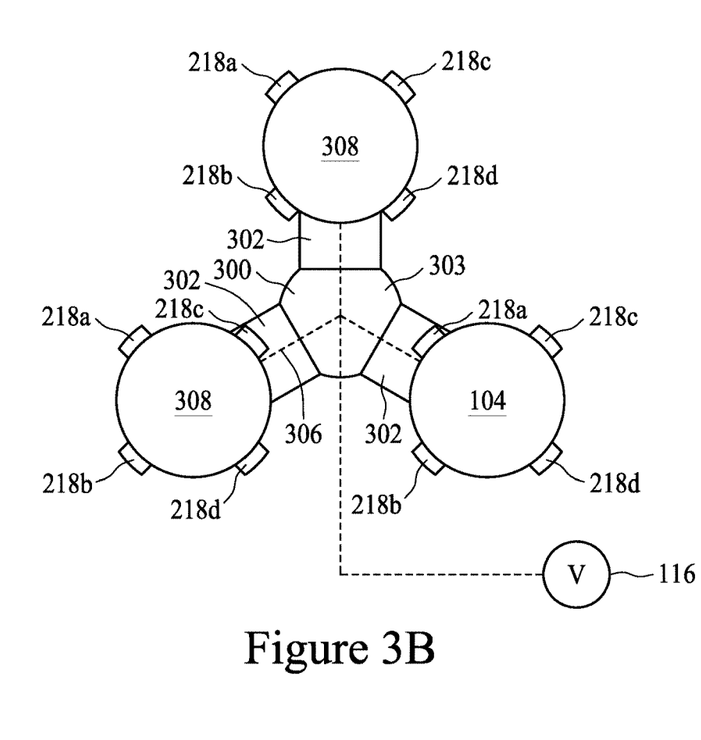
FIG. 3B is a top plan view of a robot including the vacuum chuck as shown in FIGS. 2A-2E, in accordance with some embodiments.

FIG. 3B is a top plan view of the robot 300. However, unlike FIG. 3A in which each one of the vacuum chucks 200 is holding a corresponding one of the plurality workpieces, one of the vacuum chucks 200 is holding one of the workpieces 104 and the two other vacuum chucks 200 are each holding a dummy workpiece 308. The dummy workpieces 308 may not be exposed to processing as the dummy workpieces 308 may be placed on ones of the vacuum chucks 200 to maintain the vacuum 118 generated by the vacuum source 116. The dummy workpieces 308 may be flatter than the workpieces 104 (e.g., production wafer) so that the vacuum 118 generated by the vacuum source 116 is stronger.

In view of FIGS. 3A and 3B, the plurality of vacuum lines 114 of each of the vacuum chucks 200 may be in direct fluid communication with each other through the fluid pathways 306 such that when the vacuum source 116 is activated the vacuums 118 are generated at all three of the vacuum chucks 200 mounted to the robot 300 simultaneously. When all three of the vacuums 118 at each of the vacuum chucks 200 are generated simultaneously by activating the vacuum source 116, the vacuums 118 at each one of the vacuum chucks 200 may be less strong when each of the workpieces 104 is on the vacuum chucks 200 as shown in FIG. 3A as compared to when the two dummy workpieces 308, which are flatter than the workpieces 104, and the one workpiece 104 is present on the vacuum chucks 200 as shown in FIG. 3B. For example, as the dummy workpieces 308 are flatter than the workpieces 104, this results in the vacuums 118 generated through and at the vacuum chucks 200 simultaneously being stronger as the greater flatness of the dummy workpieces 308 results in a greater vacuum or seal effect between the backside surfaces of the dummy workpieces 308 and the workpiece surface 200. Alternatively, when the three workpieces 104 are present on the three vacuum chucks 200, the vacuums 118 simultaneously being generated are weaker than the vacuums 118 generated relative to when the two dummy workpieces 308 and the one workpiece 104 is present on the vacuum chucks 200, respectively.

As discussed earlier, utilizing the vacuum chucks 200 instead of the vacuum chucks 100 results in less warpage occurring in the workpieces 104. This reduced warpage causes the vacuums 118 generated at the vacuum chucks 200 being greater than those generated when utilizing the vacuum chucks 100. When utilizing the vacuum chucks 100, the residual moisture or fluid 122 cannot effectively escape or evaporate resulting in the workpieces 104 warping by a larger amount (see FIG. 1B) as compared to when utilizing the vacuum chucks 200 (see FIG. 2B). This is because the vacuum chucks 200 include the moisture gate portion 202 that allows for the residual moisture or fluid 122 to effectively escape or evaporate. Utilizing the vacuum chucks 200 each with the moisture gate portion 202 results in the spaces 222 being smaller than the spaces 124 when utilizing the vacuum chucks 100. As the spaces 222 are smaller, the vacuum or seal effect between the backside surfaces of the workpieces 104 and the workpiece surfaces 102 of the vacuum chucks 100 is not as strong as the vacuum or seal effect between the backside surface of the workpieces 104 and the workpiece surfaces 102 of the vacuum chucks 200. In other words, the vacuums 118 generated through and at the workpiece surfaces 102 of the vacuum chucks 200 when the workpieces 104 are present is greater than when the workpieces 104 are on the vacuum chucks 100 as there is less warpage in the workpieces 104 when present on the vacuum chuck 200. In view of the above discussion, utilizing the vacuum chucks 200 instead of the vacuum chucks 100 increases the strength of the vacuum 118 as the moisture gate portions 202 of the vacuum chucks 200 allow the residual moisture or fluid 122 to effectively escape or evaporate reducing the amount of warpage and increasing the strength of the vacuums 118, respectively.

When the workpieces 104 are present on each one of the vacuum chucks 200 as shown in FIGS. 3A, the vacuums 118 generated may have a strength equal to or less than 26-kilopascal (kPa). When there are two workpieces 104 and one dummy workpiece 308 on the vacuum chucks 200, the vacuums 118 generated may have a strength equal to or less than 47-kPa. When there is one workpiece 104 and two dummy wafers 308 on the vacuum chucks 200, the vacuums 118 generated may have a strength equal to or less than 85-kPa. When there are three dummy wafers 308 on the vacuum chucks 200, the vacuums 118 generated may have a strength equal to or less than 86-kPa.

When the vacuum chucks 100 are utilized instead of the vacuum chucks 200 in FIGS. 3A and 3B, the vacuums 118 generated when there are three workpieces 104 on the vacuum chucks 100 may have a strength equal to or less than 13-kPa. When the vacuum chucks 100 are utilized instead of the vacuum chucks 200 in FIGS. 3A and 3B, the vacuums 118 generated when there are two workpieces 104 and one dummy workpiece 308 on the vacuum chucks 100 may have a strength equal to or less than 25-kPA. When the vacuum chucks 100 are utilized instead of the vacuum chucks 200 in FIGS. 3A and 3B, the vacuums 118 generated when there is one workpiece 104 and two dummy workpieces 308 on the vacuum chucks 100 may have a strength equal to or less than 46-kPA. When the vacuum chucks 100 are utilized instead of the vacuum chucks 200 in FIGS. 3A and 3B, the vacuums 118 generated when there are three dummy workpiece 308 on the vacuum chucks 100 may have a strength equal to or less than 85-kPA.

In view of the above strengths of the vacuums 118 generated when utilizing the vacuum chucks 200 and the vacuum chucks 100, the vacuums 118 generated when utilizing the vacuum chucks 200 are greater than those generated utilizing the vacuum chucks 100. However, the vacuums 118 generated when utilizing the vacuum chucks 200 and the vacuum chucks 100 are almost the same when three dummy workpieces 308 are present on each one of the vacuum chucks 100, 200, respectively. In other words, the vacuums 118 generated utilizing the vacuum chucks 200 are generally stronger than those generated utilizing the vacuum chucks 100 resulting in a stronger vacuum or seal effect on the workpieces 104 and/or the dummy workpieces 308 reducing the likelihood of shifting of the workpieces 104 and/or the dummy workpieces 308 when utilizing the vacuum chucks 200 instead of the vacuum chucks 100.

In some alternative embodiments, there may be more than one of the vacuum source 116 such that there are a plurality of vacuum sources 116. Each one of the plurality of vacuum sources 116 is each in fluid communication with a corresponding one of the vacuum chucks 200. In this alternative embodiment, the vacuums 118 at each one of the vacuum chucks 200 may be independently generated instead of being generated simultaneously all together. In other word, the vacuums 118 at each one of the vacuum chucks 200 may be independently controlled from the others.

Figure 4:
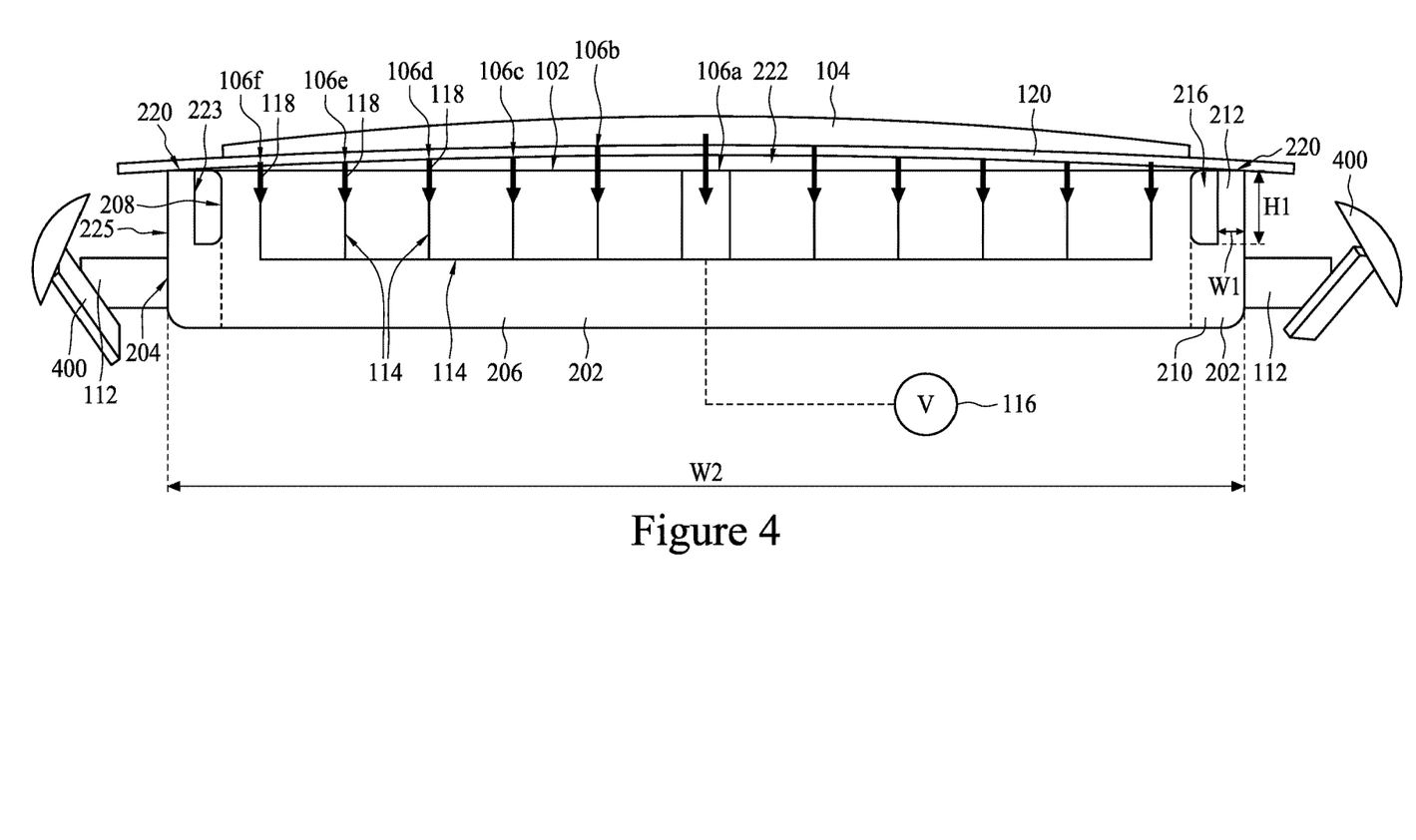
FIG. 4 is a side view of the vacuum chuck as shown in FIGS. 2A and 2B mounted to the robot as shown in FIGS. 3A and 3B, in accordance with some embodiments.

FIG. 4 is a side view of the vacuum chuck 200 as shown in FIGS. 2A and 2B held within the one or more clamps 400. The clamps 400 may be one type of mounting structure that may be utilized to mount the vacuum chuck 200 to the robot as shown in FIGS. 3A and 3B, in accordance with some embodiments. The one or more clamps 400 may be coupled to an end of one of the plurality of arms 302 of the robot 300. The one or more clamps 400 clamp onto the pair of opposing mounting structures 112, respectively, such that the vacuum chuck 200 is mounted to the end of the respective arm of the plurality of arms 302 of the robot 300. While there are two of the pair of mounting structures 112 and there are two clamps 400 as shown in FIG. 4, it will be readily appreciated that a number of the mounting structures 112 and a number of the one or more clamps 400 may be increased or decreased (e.g., 1, 3, 4, 5, etc.) such that a different number of the mounting structures 112 and a different number of the one or more clamps 400 is present in alternative embodiments.

Figure 5:
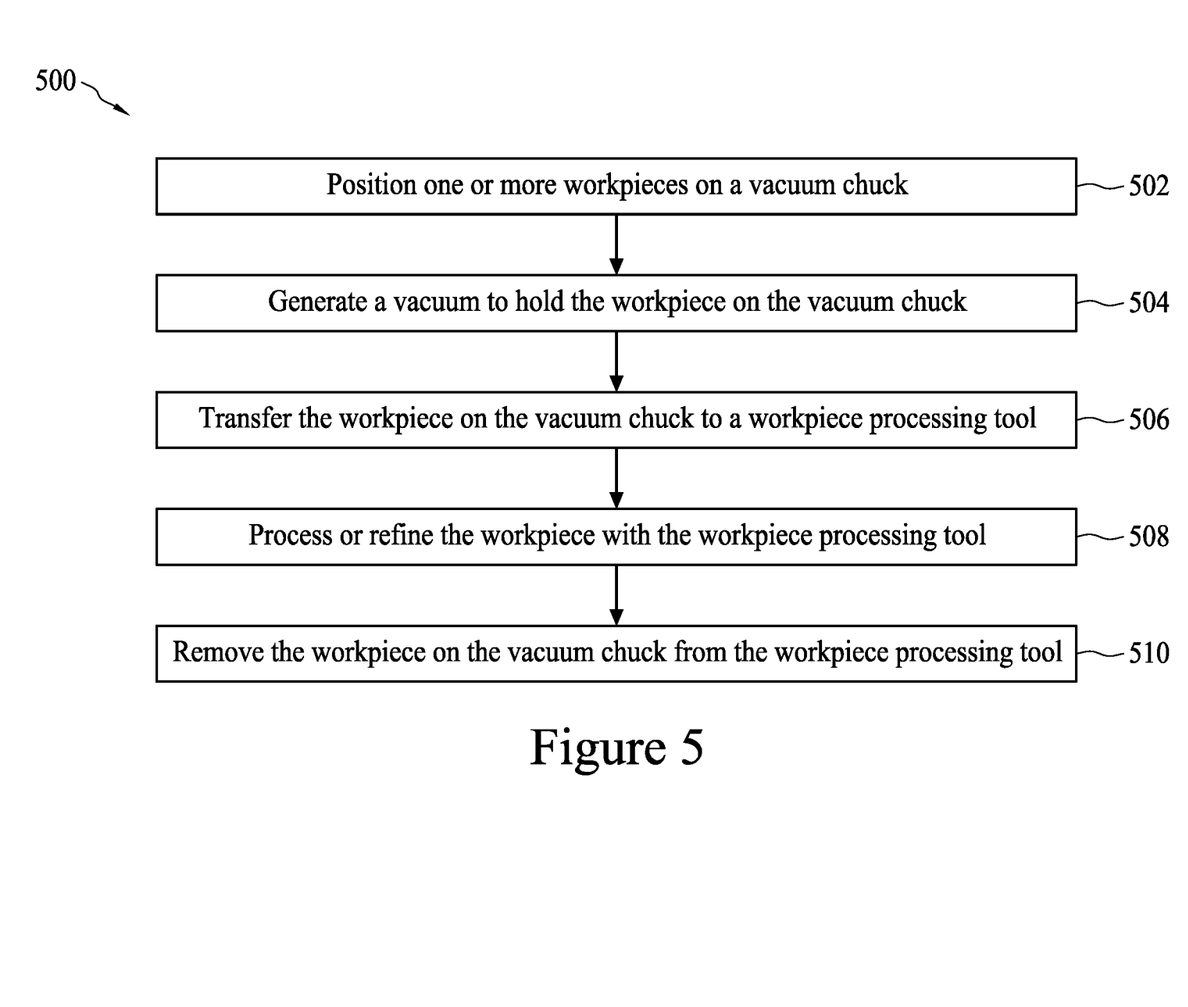
FIG. 5 is a flowchart of a method of use of the vacuum chuck as shown in FIGS. 2A-2E, in accordance with some embodiments.

FIG. 5 is a flowchart 500 of a method of use of the vacuum chuck 200 as shown in FIGS. 2A and 2E when utilized on the robot 300 as shown in FIGS. 3A and 3B. Each respective step of the flowchart 500 will be discussed in detail as follows.

In a first step 502, one or more of the workpieces 104 and/or the dummy workpieces 308 are positioned on the vacuum chucks 200 of the robot 300. For example, the workpieces 104 and/or dummy workpieces 308 may be positioned on the vacuum chucks 200 by another robot or by a user in a position similar to that as shown in FIG. 2B. The workpieces 104 and/or dummy workpieces 308 are positioned within the respective guide portions 218a, 218b, 218c, 218d such that the workpieces 104 and/or the dummy workpieces 308 are properly and correctly aligned and present on the respective workpiece surfaces 102 of the vacuum chucks 200, respectively. This proper alignment may facilitate a strong vacuum or seal effect when generating the vacuums 118. The workpieces 104 may be present on the end surfaces 220 of the plurality of protrusions 212 of the vacuum chucks 200, respectively.

After the first step 502, a second step 504 is carried out in which the vacuum source 116 is activated such that air is removed from within the spaces 222 through the plurality of vacuum lines 114 and the fluid pathways 306. Removing the air from within the spaces 222 generates the vacuum 118 resulting in a suction force holding the workpieces 104 and/or the dummy workpieces 308 on the vacuum chucks 200. If the residual moisture or fluid 122 is present on the workpieces 104, the residual moisture or fluid 122 is capable of effectively escaping or evaporating such that the residual moisture or fluid 122 is not trapped within the spaces 222 reducing the warpage of the workpieces 104. For example, the residual moisture or fluid 122 may be present as the workpieces 104 may have undergone processing or may have been exposed to a small amount of moisture when being shipped to a FAB for refinement and processing.

After second step 504, a third step 506 is carried out in which the robot 300 may articulate or actuate the plurality of arms 302 to transfer or transport the workpieces 104 and/or dummy wafers 308 between various locations within the FAB. For example, the workpieces 104 may be transferred or transported to a workpiece processing tool and then the workpieces 104 may be inserted into the workpiece processing tool for refinement and processing. The workpiece processing tool may be an etching or lithography tool, a patterning tool, an EUV lithography tool, or some other suitable type of workpiece processing tool configured to refine or process the workpieces 104. The plurality of arms 302 may be configured to extend outward and retract inward, and the central hub 303 may be configured to rotate allowing for the robot 300 to transport or transfer the workpieces 104 to and from workpiece processing tools and various locations within the FAB.

After the third step 506, in a fourth step 508 the workpiece 104 is inserted into the workpiece processing tool for processing and refining. If the workpiece processing tool utilizes a fluid or liquid to process or refine the workpiece 104, the residual moisture or fluid 122 may build up on the workpiece 104 within the workpiece processing tool as the workpiece processing tool processes or refines the workpiece 104.

After the fourth step 508, in a fifth step 510 the workpiece 104 is removed from the workpiece processing tool after being processed and/or refined. For example, if the workpiece 104 was processed or refined when present on the vacuum chuck 200, the workpiece 104 is already present on the vacuum chuck 200. Alternatively, if the workpiece 104 was previously removed from the vacuum chuck to be processed or refined by the workpiece processing tool, the workpiece 104 is repositioned onto one of the vacuum chucks 200. The residual moisture or fluid 122 that is left over from being processed or refined by the workpiece processing tool may effectively escape or evaporate through the moisture gate portion 202 maintaining a miniscule amount of warpage in the workpiece 104 or resulting in no warpage of the workpiece 104 when present on the vacuum chuck 200.

If the workpiece 104 was previously removed from the vacuum chuck 200 to be processed and refined by the workpiece processing tool, one of the dummy workpieces 308 may be positioned on the vacuum chuck 200. After the workpiece 104 is refined or processed by the workpiece processing tool, the dummy workpiece 308 present on the corresponding vacuum chuck 200 may be removed and then the processed or refined workpiece 104 may be positioned back on the vacuum chuck 200.

In view of the above discussion, any combination of the workpieces 104 and/or the dummy workpieces 308 may be positioned on the vacuum chucks 200 to carry out the method as shown in the flowchart 500. Various respective steps of the method as shown in the flowchart 500 may be completed in different orders depending on a process flow within the FAB to manufacture electronic or semiconductor devices (e.g., dice, packages, etc.). Various respective steps of the method as shown in the flowchart 500 may be completed in succession over and over again depending on a process flow within the FAB to manufacture electronic devices or semiconductor devices (e.g., dice, packages, etc.).

During the method as shown in the flowchart 500, the guide portions 218a, 218b, 218c, 218d act as barriers that prevent the workpieces 104 and/or the dummy workpieces 308 from shifting on the vacuum chucks 200 when being transferred or transported, and act as barriers to prevent the workpieces 104 and/or the dummy workpiece 308 from falling off the vacuum chucks 200. During the method as shown in the flowchart 500, the workpiece 104 may be on the carrier 120 such that the carrier 120 comes into contact with the end surfaces 220 of the plurality of protrusions 212 of the vacuum chuck 200.

In view of the discussion herein, utilizing the vacuum chuck 200 instead of the vacuum chuck 100 reduces an amount of warpage in the workpiece 104 and the carrier 120 as the moisture gate portion 202 of the vacuum chuck 200 effectively allows for the residual moisture or fluid 122 to escape or evaporate unlike the vacuum chuck 100. This reduced warpage reduces a likelihood of shifting or misalignment of the workpiece 104 on the vacuum chuck 200 relative to when utilizing the vacuum chuck 100. This reduced warpage of the workpieces 104 when utilizing the vacuum chuck 200 increases the strength of the vacuum 118 relative to when utilizing the vacuum chuck 100. The presence of the guide portions 218a, 218b, 218c, 218d of the vacuum chuck reduces the likelihood of shifting of the workpieces 104 and/or the dummy workpieces 308 when present on the vacuum chuck 200 relative to when present on the vacuum chuck 100, which does not include the guide portions 218a, 218b, 218c, 218d. The presence of the guide portions 218a, 218b, 218c, 218d of the vacuum chuck reduces the likelihood of the workpieces 104 and/or the dummy workpieces 308 falling when present on the vacuum chuck 200 relative to when present on the vacuum chuck 100, which does not include the guide portions 218a, 218b, 218c, 218d. In view of this discussion, the reduction in warpage of the workpieces 104 when utilizing the vacuum chuck 200, increases a yield number of electronic or semiconductor devices (e.g., dice, packages, etc.) that are manufactured within tolerance and are capable of being sold to customers, which reduces waste expenses and increases profitability.

In view of the discussion within the present disclosure, embodiments of the vacuum chuck 200 of the present disclosure may be utilized in the manufacture of integrated fan out (InFO) semiconductor packages, an InFO_B semiconductor package, chip-on-wafer-on-substrate semiconductor packages (CoWoS), large-scale integration (LSI) semiconductor packages, or may be utilized in the formation of any number of suitable types of semiconductor packages. More specifically, the vacuum chuck 200 may be utilized during manufacturing these various types of semiconductor packages by maintaining a position of various components on the vacuum chuck 200 (e.g., a silicon wafer) utilizing the vacuum passing through the vacuum chuck while also reducing the likelihood, or in some instance, preventing moisture damage to the various components present on the vacuum chuck 200. For example, the vacuum chuck 200 may be at an end of a respective arm of a transfer robot present within the FAB to transfer pieces between various semiconductor manufacturing and processing tools within the FAB to manufacture the various types of semiconductor packages.

A vacuum chuck may be summarized as including a central vacuum portion including a workpiece surface; a peripheral edge spaced outward from the central vacuum portion; a peripheral drainage portion present at the peripheral edge, the peripheral drainage portion including a drainage channel; and a vacuum line extending into the central vacuum portion, the vacuum line including a vacuum opening at the workpiece surface of the central vacuum portion.

A system may be summarized as including a workpiece transfer device including a clamp; and a vacuum chuck mounted to the workpiece transfer device by the clamp, the vacuum chuck including: a central vacuum portion including a workpiece surface; a peripheral edge spaced outward from the central vacuum portion; a peripheral drainage portion present at the peripheral edge, the peripheral drainage portion including a drainage channel; and a vacuum line extending into the central vacuum portion, the vacuum line including a vacuum opening at the workpiece surface of the central vacuum portion.

A method may be summarized as including positioning a workpiece on a vacuum chuck to overlap a plurality of extensions of a peripheral drainage portion of a vacuum chuck adjacent to a peripheral edge of the vacuum chuck; generating a vacuum through a plurality of vacuum openings at a workpiece surface of the vacuum chuck through a plurality of vacuum lines in the vacuum chuck; and utilizing the vacuum to hold the workpiece on the vacuum chuck.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A vacuum chuck, comprising:
a central vacuum portion including a workpiece surface;
a peripheral edge spaced outward from the central vacuum portion, the peripheral edge surrounding the central vacuum portion;
a peripheral drainage portion present between the peripheral edge and the central vacuum portion, the peripheral drainage portion including a drainage channel and a plurality of extensions, and the plurality of extensions extend from the peripheral edge to the drainage channel; and
a vacuum line extending into the central vacuum portion, the vacuum line including a vacuum opening at the workpiece surface of the central vacuum portion.

2. The vacuum chuck of claim 1, wherein:
the drainage channel is between the central vacuum portion and the plurality of extensions, and the drainage channel surrounds the central vacuum portion.

3. The vacuum chuck of claim 2, wherein the central vacuum portion includes a center, and the drainage channel is closer to the center of the central vacuum portion than the plurality of extensions.

4. The vacuum chuck of claim 3, wherein each one of the plurality of extensions is spaced apart from an adjacent one of the plurality of extensions by the drainage channel.

5. The vacuum chuck of claim 3, wherein each one of the plurality of extensions further includes a sidewall facing towards the central vacuum portion and an end surface transverse to the sidewall.

6. The vacuum chuck of claim 2, wherein:
the central vacuum portion further includes a sidewall facing towards the extension, the sidewall of the central vacuum portion is transverse to the workpiece surface;
the extension further includes a sidewall facing towards the sidewall of the central vacuum portion; and
the drainage channel extends from the sidewall of the central vacuum portion to the sidewall of the extension.

7. The vacuum chuck of claim 2, wherein each respective extension of the plurality of extensions further includes an end surface coplanar with the workpiece surface of the central vacuum portion.

8. The vacuum chuck of claim 1, further comprising:
a mounting portion extending from the peripheral drainage portion; and
a workpiece guide structure extending from the mounting portion.

9. The vacuum chuck of claim 1, wherein the drainage channel has an L-shape.

10. The vacuum chuck of claim 1, wherein the drainage channel includes a first portion that surrounds the central vacuum portion and a plurality of second portions that extend from the first portion to the drainage channel to the peripheral edge.

11. The vacuum chuck of claim 10, wherein the peripheral drainage portion further includes a plurality of extensions, each one of the plurality of extensions is spaced apart from an adjacent one of the plurality of extensions by the plurality of second portions of the drainage channel.

12. A system, comprising:
a workpiece transfer device including a clamp; and
a vacuum chuck mounted to the workpiece transfer device by the clamp, the vacuum chuck including:
a central vacuum portion including a workpiece surface;
a peripheral edge spaced outward from the central vacuum portion, the peripheral edge surrounding the central vacuum portion;
a peripheral drainage portion present between the peripheral edge and the central vacuum portion, the peripheral drainage portion including a drainage channel and a plurality of extensions, and the plurality of extensions extend from the peripheral edge to the drainage channel; and
a vacuum line extending into the central vacuum portion, the vacuum line including a vacuum opening at the workpiece surface of the central vacuum portion.

13. The system of claim 12, wherein:
the drainage channel is between the central vacuum portion and the plurality of extensions, and the drainage channel surrounds the central vacuum portion.

14. The system of claim 13, wherein the central vacuum portion includes a center, and the drainage channel is closer to the center of the central vacuum portion than the plurality of extensions.

15. The system of claim 14, wherein each one of the plurality of extensions is spaced apart from an adjacent one of the plurality of extensions by the drainage channel.

16. The system of claim 15, wherein the drainage channel of the vacuum chuck further includes:
a first portion that surrounds the central vacuum portion; and
a plurality of second portions that extend from the first portion to the peripheral edge, and the plurality of second portions are positioned between ones of the plurality of extensions and space adjacent ones of the plurality of extension from each other.

17. The system of claim 12, wherein:
the vacuum chuck further includes:
a mounting portion extending outward from the peripheral edge; and
a workpiece guide structure spaced outward from the peripheral edge and extending from the mounting portion;
the clamp mechanically engages with the mounting portion to mount the vacuum chuck to the workpiece transfer device.

18. A vacuum chuck, comprising:
a central vacuum portion including a workpiece surface;
a peripheral edge spaced outward from the central vacuum portion, the peripheral edge surrounding the central vacuum portion;
a peripheral drainage portion present between the peripheral edge and the central vacuum portion, the peripheral drainage portion including a main drainage channel, a plurality of extensions, and a plurality of sub-drainage channels that extend outward from the main drainage channel to the peripheral edge, and each respective sub-drainage channel of the plurality of sub-drainage channels is at least partially delimited by respective pair of extensions of the plurality of extensions; and
a vacuum line extending into the central vacuum portion, the vacuum line including a vacuum opening at the workpiece surface of the central vacuum portion;
a first mounting portion extending outward from the peripheral edge, the first mounting portion including a first guide structure configured to, in operation, direct placement of a workpiece onto the workpiece surface of the central vacuum portion; and a second mounting portion extending outward from the peripheral edge, the second mounting portion including a second guide structure configured to, in operation, guide the workpiece onto the workpiece surface of the central vacuum portion.

19. The vacuum chuck of claim 18, wherein the first mounting portion is opposite to the second mounting portion about the central vacuum portion.

20. The vacuum chuck of claim 18, wherein
a first width of each respective extension of the plurality of extensions is equal to a second width of each respective sub-drainage channel of the plurality of sub-drainage channels.

\* \* \* \* \*